(12) United States Patent
Sridhar et al.

(10) Patent No.: US 10,811,269 B2
(45) Date of Patent: Oct. 20, 2020

(54) METHOD TO ACHIEVE A SIDEWALL ETCH

(71) Applicant: Tokyo Electron Limited, Minato-ku, Tokyo (JP)

(72) Inventors: Shyam Sridhar, Albany, NY (US);
Nayoung Bae, Albany, NY (US);
Sergey Voronin, Albany, NY (US);
Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/277,760

(22) Filed: Feb. 15, 2019

(65) Prior Publication Data

US 2019/0259623 A1  Aug. 22, 2019

Related U.S. Application Data

(60) Provisional application No. 62/665,785, filed on May 2, 2018, provisional application No. 62/632,394, filed on Feb. 19, 2018.

(51) Int. Cl.
*H01L 21/306* (2006.01)
*H01L 21/3065* (2006.01)
*H01L 21/311* (2006.01)
*H01L 21/3213* (2006.01)
*H01L 21/02* (2006.01)
*H01L 21/308* (2006.01)

(52) U.S. Cl.
CPC .... *H01L 21/3065* (2013.01); *H01L 21/02238* (2013.01); *H01L 21/02247* (2013.01); *H01L 21/02252* (2013.01); *H01L 21/3083* (2013.01); *H01L 21/31116* (2013.01); *H01L 21/31138* (2013.01); *H01L 21/31144* (2013.01); *H01L 21/32137* (2013.01)

(58) Field of Classification Search
CPC .......... H01L 21/3065; H01L 21/02252; H01L 21/3083; H01L 21/02238; H01L 21/02247; H01L 21/31138; H01L 21/32137; H01L 21/31144; H01L 21/31116
See application file for complete search history.

(56) References Cited

U.S. PATENT DOCUMENTS

2017/0316940 A1* 11/2017 Ishikawa ........... H01L 21/02211
2018/0286663 A1* 10/2018 Kobayashi .......... H01L 21/0234
2019/0057858 A1*  2/2019 Hausmann .......... H01L 21/0228

* cited by examiner

*Primary Examiner* — Duy Vu N Deo
(74) *Attorney, Agent, or Firm* — Rothwell, Figg, Ernst & Manbeck, P.C.

(57) ABSTRACT

Sidewall etching of substrate features may be achieved by employing an etch stop layer formed over the features. The etch stop layer is thinner on sidewalls of the features as compared to the bottom of the features. The lateral etching of the features is achieved by use of an over etch which breaks through the etch stop layer on the sidewalls of the features but does not break through the etch stop layer formed at the bottom of the features. The use of the etch stop layer allows for lateral etching while preventing unwanted vertical etching. The lateral etching may be desirable for use in a number of structures, including but not limited to 3D structures. The lateral etching may also be used to provide vertical sidewalls by reducing the sidewall taper angle.

19 Claims, 6 Drawing Sheets

```
┌─────────────────────────────────────────────────────────────┐
│ PLASMA ETCHING FIRST FEATURES ON THE SUBSTRATE, THE FIRST   │
│ FEATURES HAVING SIDEWALL SURFACES AND BOTTOM SURFACES, THE  │─ 705
│ SIDEWALL SURFACES BEING FORMED OF A SIDEWALL MATERIAL AND THE│
│ BOTTOM SURFACES BEING FORMED OF A BOTTOM MATERIAL           │
└─────────────────────────────────────────────────────────────┘
                               │
                               ▼
┌─────────────────────────────────────────────────────────────┐
│ FORMING AN ETCH STOP LAYER OVER THE SIDEWALL SURFACES AND THE│
│ BOTTOM SURFACES UTILIZING A PLASMA PROCESS, THE THICKNESS OF THE│─ 710
│ ETCH STOP LAYER VARYING, WHEREIN THE ION FLUX AND ENERGY IS │
│ CONTROLLED BY SOURCE AND BIAS RF POWER TO RESULT IN THE ETCH│
│ STOP LAYER BEING THICKER ON THE BOTTOM SURFACES AND THINNER │
│                ON THE SIDEWALL SURFACES                     │
└─────────────────────────────────────────────────────────────┘
                               │
                               ▼
┌─────────────────────────────────────────────────────────────┐
│ SUBJECTING THE ETCH STOP LAYER TO AN ETCH STOP LAYER PLASMA ETCH│─ 715
│ STEP IN WHICH THE ETCH STOP LAYER IS REMOVED FROM THE SIDEWALL│
│ SURFACES WHILE LEAVING AT LEAST A PORTION OF THE ETCH STOP LAYER│
│ ON THE BOTTOM SURFACES SO AS TO PROTECT THE BOTTOM SURFACES │
│ FROM THE ETCH STOP LAYER PLASMA ETCH STEP, WHEREIN THE ETCH │
│ STOP LAYER PLASMA ETCH STEP ETCHES AT LEAST A PORTION OF THE│
│ SIDEWALL SURFACES OF THE FIRST FEATURES WHILE NOT ETCHING THE│
│          BOTTOM SURFACE OF THE FIRST FEATURE                │
└─────────────────────────────────────────────────────────────┘
```

METHOD TO ACHIEVE A SIDEWALL ETCH

This application claims priority to Provisional Patent Application Nos. 62/632,934, titled, Method To Achieve A Vertical Etch Profile, filed Feb. 2, 1018 and 62/665,785, titled, Method To Achieve A Sidewall Etch, filed May 2, 2018; the disclosures of which are expressly incorporated herein, in their entirety, by reference.

BACKGROUND

The present disclosure relates to the processing of substrates in plasma process equipment. In particular, it provides a method for etching of substrates.

The use of plasma systems for the processing of substrates has long been known. For example, plasma etch processing of semiconductor wafers is well known. Historically, plasma etching systems have been utilized to provide selective anisotropic etching techniques. However, etching features laterally is becoming more important in substrate processing, including for example, for forming three dimensional (3D) devices. When etching features laterally, it is often desirable to be able to achieve a lateral etch without further etching the structure in a vertical direction.

Further, as critical dimensions of features formed on substrates continue to shrink, etching vertically without tapered sidewalls while forming a flat bottom has become more important. Various factors affect the feature profile including ion energy and angular distribution, radical and ion flux, etch byproduct re-deposition, mask erosion, etc. Resulting etch profiles may be non-ideal. Thus, etch profiles may consist of tapered sidewalls. Achieving ideal profiles, i.e. vertical sidewalls with a flat bottom, requires precise control of various plasma parameters such as ion angular distribution, ion and radical fluxes, etc. Quite often, the resulting etching profile may have sidewalls that are tapered with a flat bottom or vertical sidewalls with rounded bottom.

The materials within which a sidewall may wish to be etched may be wide ranging including silicon, silicon nitrides, silicon oxides, other dielectrics, conductive materials, etc. all as is known in the substrate processing art. For example, any of a wide range of materials and layers may be used in substrate processing (for example semiconductor processing) and at various times in the process it may be desirable to lateral etch a structure and/or form a vertical sidewall in the materials or layers by the use of an etching process.

In one embodiment, it would be desirable to provide an etching process that provides for improved etching of the sidewalls of layers, such as for example but not limited to, improved lateral etching of layers. For example, it may be desirable to perform lateral etching of silicon or silicon nitride layers. In another embodiment, it would be desirable to provide an etching process that provides for improved sidewall etching of layers to provide vertical sidewalls, such as for example but not limited to, lateral etching of silicon or silicon nitride layers.

SUMMARY

Sidewall etching of substrate features may be achieved by employing an etch stop layer formed over the features. The etch stop layer is thinner on sidewalls of the features as compared to the bottom of the features. The lateral etching of the features is achieved by use of an over etch (or additional etch) which breaks through the etch stop layer on the sidewalls of the features but does not break through the etch stop layer formed at the bottom of the features. The use of the etch stop layer allows for lateral etching while preventing unwanted vertical etching. The lateral etching may be desirable for use in a number of structures, including but not limited to 3D structures. The lateral etching may also be used to provide vertical sidewalls by reducing the sidewall taper angle.

The method may be include a first etch step that provides a tapered sidewall profile in a structure. An etch stop layer may be formed via a plasma in a manner that such that the etch stop layer is thinner on the sidewalls of structures as compared to the bottom of structures. Next an over etch step may be used that will break through the etch stop layer on the sidewalls of the structure (the thinner regions of the etch stop layer) while not breaking through the etch stop layer at the bottom of the structure (the thicker regions of the etch stop layer). In this manner, the over etch step may be used to etch the tapered sidewalls into vertical sidewalls without further etching of the bottom of the structure.

In another embodiment, the first etch step may provide either vertical or tapered sidewall profiles in a structure. As in the prior embodiment, an etch stop layer may be formed via a plasma in a manner that such that the etch stop layer is thinner on the sidewalls of structures as compared to the bottom of structures. Next an over etch step may be used that will break through the etch stop layer on the sidewalls of the structure (the thinner regions of the etch stop layer) while not breaking through the etch stop layer at the bottom of the structure (the thicker regions of the etch stop layer). In this manner, the over etch step may be used to laterally etch the sidewalls of the structure without further etching of the bottom of the structure.

In one embodiment a method of etching a substrate is provided. The method may comprise providing first features on the substrate, the first features having sidewall surfaces and bottom surfaces, the sidewall surfaces being formed of a sidewall material and the bottom surfaces being formed of a bottom material. The method may further comprise forming an etch stop layer over the sidewall surfaces and the bottom surfaces utilizing a plasma process, the thickness of the etch stop layer varying, wherein the etch stop layer is thicker on the bottom surfaces and thinner on the sidewall surfaces. The method further comprises subjecting the etch stop layer to an etch stop layer plasma etch step in which the etch stop layer is removed from the sidewall surfaces while leaving at least a portion of the etch stop layer on the bottom surfaces so as to protect the bottom surfaces from the etch stop layer plasma etch step, wherein the etch stop layer plasma etch step etches the first features by etching the sidewall surfaces of the first features laterally.

In another embodiment a method of etching a substrate is provided. The method comprises plasma etching first features on the substrate, the first features having sidewall surfaces and bottom surfaces, the sidewall surfaces being formed of a sidewall material and the bottom surfaces being formed of a bottom material. The method further comprises forming an etch stop layer over the sidewall surfaces and the bottom surfaces utilizing a plasma process, the thickness of the etch stop layer varying, wherein the ion flux and energy is controlled by source and bias radio frequency (RF) power to result in the etch stop layer being thicker on the bottom surfaces and thinner on the sidewall surfaces. The method also comprises subjecting the etch stop layer to an etch stop layer plasma etch step in which the etch stop layer is removed from the sidewall surfaces while leaving at least a portion of the etch stop layer on the bottom surfaces so as to protect the bottom surfaces from the etch stop layer plasma etch step, wherein the etch stop layer plasma etch step etches at least a portion of the sidewall surfaces of the first features while not etching the bottom surfaces of the first feature.

In yet another embodiment a method of etching silicon features of a substrate is provided. The method comprises forming the silicon features on the substrate utilizing a masking layer, the silicon features having sidewall surfaces and bottom surfaces. The method further comprises forming an etch stop layer over the sidewall surfaces and the bottom surfaces utilizing a plasma process, the thickness of the etch stop layer varying, wherein the plasma process is controlled to result in the etch stop layer being thicker on the bottom surfaces and thinner on the sidewall surfaces. The method further comprise subjecting the etch stop layer to a fluorine plasma etch step in which the etch stop layer is removed from the sidewall surfaces while leaving at least a portion of the etch stop layer on the bottom surfaces so as to protect the bottom surfaces from the fluorine plasma etch step, wherein the fluorine plasma etch step etches at least a portion of the sidewall surfaces of the silicon features while not etching the bottom surfaces of the silicon features.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

In one embodiment lateral etching of a structure may be achieved by forming a etch stop layer by use of a plasma process. The formation of the etch stop layer may alternatively be formed by other processes, as the techniques described herein are not limited to the use of a plasma process to form the etch stop. The method may comprise a three step process. First, an etch step is used to define the shape of a structure, the structure having sidewalls and a bottom. This step need not necessarily produce vertical sidewall profiles, as the techniques described herein may be utilized with a first step that provides tapered sidewalls or a first step that provides vertical sidewalls. The second step may include a process for forming an etch stop layer. In one embodiment, the process may be a plasma process. In another embodiment, the process may be a plasma oxidation or a plasma nitridation process. The third step may be an over etch (or additional etch) step. The over etch step may be used to provide lateral etching. The lateral etching may be used to undercut a mask (such as used in 3D structures) and/or to provide a more vertical sidewall for the structure. In in the case of undercut, the critical dimensions of the features formed on the substrate may be smaller than the critical dimensions of the mask layer overlying the features.

The etch stop layer formation step may be a plasma process in which ion flux and energy can be controllable by source and bias RF power. Thus for example, the etch stop layer growth may be driven by ions rather than radicals. The thickness of etch stop layer formed by this etch layer formation step depends on the penetration depth of the ions which increases with ion energy. Due to the directional nature of the ions, the thickness of etch stop layer formed will be higher on horizontal surfaces compared to vertical or tapered surfaces, where etch stop layer is radical driven. At sufficiently high ion energies, the etch stop layer could be thick enough (few nm's) enabling it to act as an etch stop layer. In one embodiment, the plasma process is an oxidation process which forms an oxide etch stop layer, for example a silicon oxide. In another embodiment, the plasma process is a nitridation process which forms a nitride etch stop layer, for example a silicon nitride. It will be recognized that other materials may be used as the etch stop layer, and the choice of the etch stop layer may depend upon the materials of the structure that is being etched.

After the etch stop layer is formed, an over etch step may be used. However, since the etch stop layer formed on the sidewalls (that are either tapered or vertical) is relatively thin and is easier to breakthrough, the sidewalls may be etched when the sidewall etch stop layer is broken through while the etch stop layer still protects other regions such as bottom regions of the structure. Choosing the appropriate etch gas chemistry for the over etch step can enable lateral etching with no further etching at the bottom of the structure as the etch stop layer is thicker at the bottom of the structure. As mentioned above, the over etch step may also be used for lateral etching (such as may be desired during the creation of 3D structures) as breaking through the etch stop layer on the sidewalls (but not the bottom) allows for lateral etching without further vertical etching of the structure at the bottom of the structure.

As mentioned, one exemplary use of the techniques described herein may be for the use of etching a silicon structure. Further, the etch stop layer may be a silicon oxide layer. Described next is the process as used for etching a silicon structure and the use of a silicon oxide etch stop layer (as mentioned, however, the techniques described herein may be used with other materials). In this example, after the silicon structure is etched in the first etch step, an in-situ silicon oxide etch stop layer is formed by exposing the sample to an oxygen ($O_2$) plasma. The sample is also biased to allow O+ ion bombardment resulting in its implantation. For a given ion energy, the depth of ion implantation is much higher for ions that are incident normally to a given surface (e.g. the surface at the feature bottom). The ion implantation depth is more shallow for near grazing incident angles (such as feature sidewall surfaces). Thus, the thickness of the oxide layer formed by ion implantation is greater on horizontal surfaces (near normal ion incidence) compared to vertical surfaces (grazing ion incidence). The thicker oxide layer allows for the use of an over etch step that is aggressive enough to break through the oxide formed on sidewalls, but does not increase the vertical etch depth (because the oxide is thicker at the bottom surface, protecting the bottom surfaces from the over etch step). In one embodiment for use with an oxide etch stop layer, the over etch may be a fluorine based etch chemistry. Once the relatively thin oxide layer on the sidewalls is etched through, the silicon on sidewalls is exposed. With appropriate choice of etch chemistry, the sidewalls may be etched selective to the in-situ oxide layer formed at the bottom of the feature, resulting in reduction of sidewall etching of the silicon. The sidewall etching may be used, for example, to form 3D structures or adjust the taper angle of the silicon. In this manner, a fluorine plasma etch step laterally etches the silicon while not etching the bottom of the features.

The etch stop layer may be formed of any of a wide variety of materials known in the substrate processing art that provide etch selectivity. In one embodiment, the etch stop layer may be an oxide layer. In a particular embodiment, the oxide layer may be a silicon oxide layer. In another embodiment, the etch stop layer may be a nitride layer. In a particular embodiment, the nitride layer may be a silicon nitride. It will be recognized that the etch stop layer may be formed of many of materials and that the particular material used may depend on what material the structure that is to be etched is formed of. The structure that is being etched may be formed of any of a wide variety of materials used in substrate processing. In one example, the structure may be formed of silicon. However, it will be recognized that the structure being etched may be silicon, silicon oxide, silicon nitride, other dielectrics, conductor materials, etc.

The figures provided herein illustrate the use of the techniques disclosed herein for lateral etching. In one embodiment, the lateral etching reduces the sidewall taper angle of the material being etched. In another embodiment, the lateral etching provides an etch undercut.

Figure 1A:
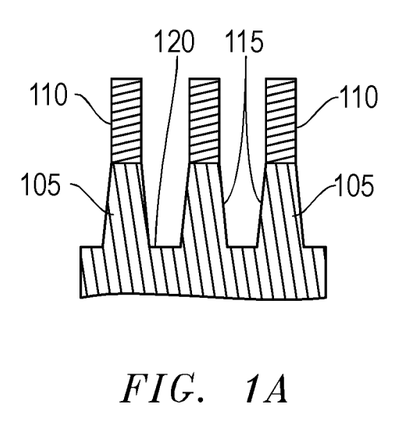
FIGS. 1A-1C illustrate one exemplary process flow utilizing the etch stop layer and lateral etching techniques described herein.
Figure 1B:
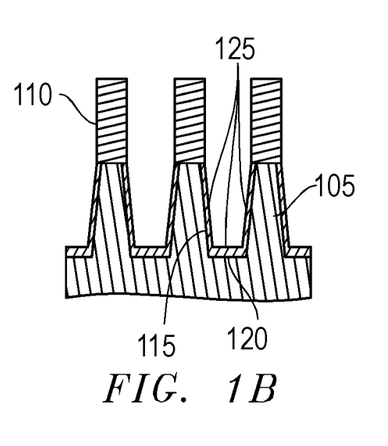
Figure 1C:
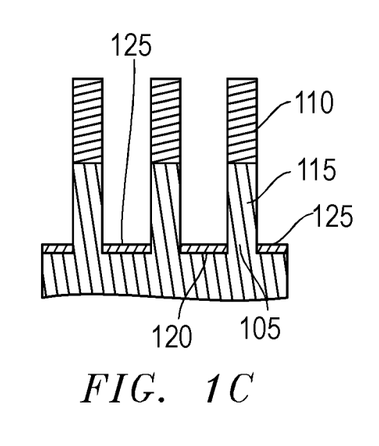

As shown in the steps of FIG. 1, an etched structure (silicon in this exemplary embodiment) having a tapered profile may be made to be more vertical. As shown in FIGS. 1A-1C, a masking layer 110 is utilized to form features 105 on a substrate. In one embodiment, the features 105 may be features of a semiconductor wafer. However, it will be recognized that the techniques described herein are relevant to other substrates. The masking layer 110 may be any of a wide range of masking layers known in the substrate processing art. For example, the masking layer 110 may be a photolithography layer, such as for example photoresist. The masking layer 110 may also be a hard mask layer. The masking layer 110 may alternatively be other types of mask layers. As shown in FIGS. 1A-1C, the features 105 may include sidewall surfaces 115 and bottom surfaces 120. In the example shown, the features 105 are shown as being a single material, however, it will be recognized that the features 105 of the substrate may be formed of multiple materials or multiple layers of materials. For example, in one embodiment, the upper portions of the features 105 (for example what forms the sidewall surfaces 115) may be one type of material and the bottom portions of the features 105 (for example what forms the bottom surfaces 120) may be another type of material. Further, it will be recognized that a substrate on which the features 105 are formed may include many layers and other features not shown, all is would be known to those skilled in the art. In the embodiment of FIGS. 1A-1C, the sidewall surfaces 115 are not vertical but rather have a tapered sidewall, thus providing non-vertical sidewalls as shown.

As shown in FIG. 1A, the features 105 have been formed according to the pattern defined by the masking layer 110. In one example, the features have been formed by any of a wide variety of masking and etch techniques, as is known in the substrate processing art. Thus, in one embodiment, a first feature plasma etch process may be used to form features 105 of FIG. 1A. The techniques described herein are not limited to a particular approach utilized to provide the structures as shown in FIG. 1A. After formation of the features 105 shown in FIG. 1A, the process includes the formation of an etch stop layer 125 as shown in FIG. 1B. As shown in the figure, the thickness of the etch stop layer 125 along the sidewall surfaces 115 is thinner than the thickness of the etch stop layer 125 along the bottom surfaces 120.

Next after the process step of FIG. 1B, the substrate is subjected to an etch that is sufficient to break through the thinner etch stop layer 125 on the sidewall surfaces 115 while not breaking through the thicker etch stop layer 125 on the bottom surfaces 120. In one embodiment, an etch stop layer plasma etch step is utilized. Thus, as shown in FIG. 1C, etch stop layer 125 remains on the bottom surfaces 120. By breaking through in the sidewall regions but not the bottom regions, the bottom portions of the features 105 are protected from further etching. However, the sidewall portions of the features 105 are subjected to further etching. In the example of FIGS. 1A-1C, this further etching provides lateral etching of the sidewall surfaces 115 of the features 105 in a manner that renders the sidewall surfaces 115 to be more vertical then before the etch as shown in the resulting structure of FIG. 1C. In this manner, the plasma etch step after formation of the etch stop layer laterally etches the features 105 while not providing further etching of the bottom surfaces 120.

Figure 2A:
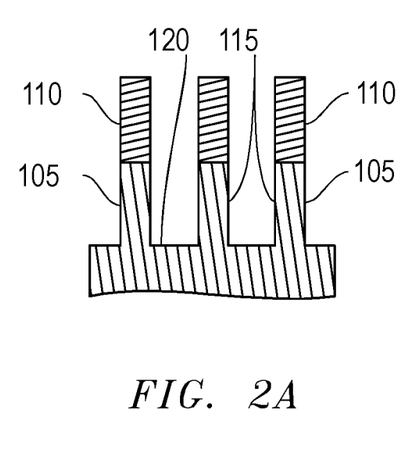
FIGS. 2A-2C illustrate another exemplary process flow utilizing the etch stop layer and lateral etching techniques described herein.
Figure 2B:
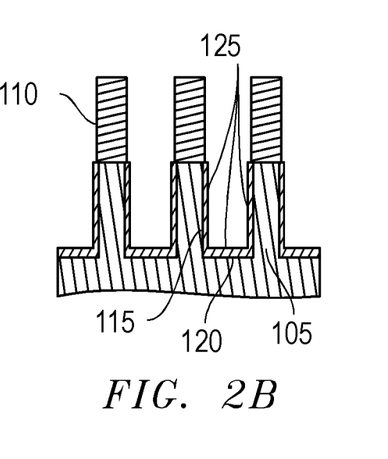
Figure 2C:
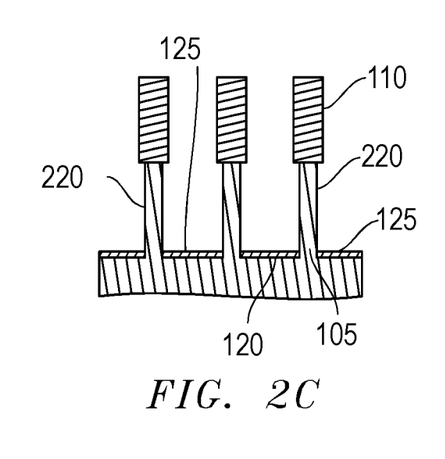

FIGS. 2A-2C provide a corresponding process flow similar to that shown in FIGS. 1A-1C. However, in FIGS. 2A-2C the sidewall surfaces 115 of FIGS. 2A-2C are more vertical than those of FIGS. 1A-1C and the lateral etching is utilized to provide undercutting of the masking layer 110. As with FIG. 1B, FIG. 2B illustrates the formation of the etch stop layer 125 in manner such that the etch stop layer 125 is thinner on the sidewall surfaces 115 and thicker on the bottom surfaces 120. FIG. 2C illustrates the effect of additional etching that is used to break through the etch stop layer 125 where the etch stop layer 125 is thinner on the sidewalls. The effect of the additional etching in the example of FIG. 2C is to provide undercut sidewalls 220. As shown in FIG. 2C, the lateral etching that results from the additional etching provides undercut sidewalls 220 that undercut the masking layer 110. The lateral etching shown in the process flow of FIGS. 2A-2C may be particularly useful in the formation of 3D structures on a substrate.

In one embodiment, the features 105 of FIGS. 1A-1C and 2A-2C are formed of silicon. In one particular embodiment, the etch stop layer 125 is a silicon oxide layer formed by a plasma oxidation process. In another particular embodiment, the etch stop layer 125 is a silicon nitride layer formed by a plasma nitridation process. As mentioned above, however, other materials may be used for the features and the etch stop layer while still gaining the benefit of the techniques described herein. In one embodiment, the etch step that is used to break through the etch stop layer in the sidewall regions is a fluorine based plasma etch. Again, however, it will be recognized that other etch techniques may be utilized.

Figure 3:
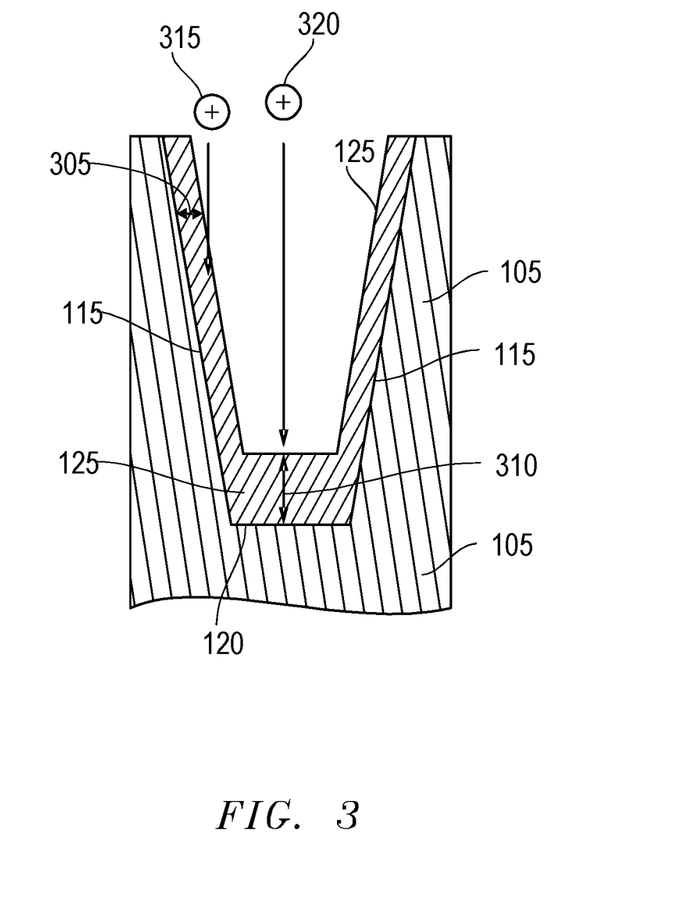
FIG. 3 illustrates the impact of ion bombardment grazing angles upon the etch stop layer thickness.

A more detailed view of the formation of the etch stop layer 125 may be seen in FIG. 3 (in this example along tapered sidewalls such as shown in FIG. 1B). As shown in FIG. 3, the thickness of the etch stop layer 125 is thinner on the sidewall surfaces 115 of the features 105 than at the bottom surfaces 120 of the features 105. The relative thicknesses of the etch stop layer 125 on the sidewall surfaces 115 and bottom surfaces 120 may be dependent upon the fluence of the implanted ions (ion flux×process time) and the ion penetration depth. The fluence of the implanted ions is dependent upon the ion/radical ($n_i/n_n$) density which is impacted by the plasma source power, pressure and gas rations. The ion energy depth depends upon the ion energy, $E_i$ which is impacted by plasma bias power and pressure.

More specifically, as shown in FIG. 3 the features 105 have sidewall surfaces 115 and bottom surfaces 120. The plasma may be biased to provide ions 315 and 320 which will bombard the substrate (in one example O+ ion bombardment to form an oxide) resulting in implantation of the ions. For a given ion energy, the depth of ion implantation is much higher for ions that are incident normally to a given surface (e.g. ions 320 that bombard the bottom surfaces 120 of the features 105) and the ion implantation depth is more shallow for near grazing incident angles (such as ions 315 that bombard the sidewall surfaces 115 of the features 105). The etch stop layer thicknesses will approximately track the ion implantation depth. Thus, the bottom thickness 310 of the etch stop layer 125 formed by ion implantation is greater on horizontal surfaces (near normal ion incidence) such as the bottom surfaces 120 as compared to sidewall thickness 305 of the etch stop layer 125 on vertical surfaces (grazing ion incidence) such as the sidewall surfaces 115.

In one embodiment, the etch stop layer formation process may be an RF plasma oxidation step having process conditions of RF power at approximately 150 Watts, RF bias power between 25-150 Watts, pressure at 50 milliTorr, and oxygen gas and argon gas at 20 standard cubic centimeters per minute (sccm) and 60 sccm respectively or 80 sccm and 240 sccm respectively. In one exemplary process, for an ion energy of approximately 500 eV, the sidewall thickness 305 may be an oxide in the range of 2.5 nm to 3 nm and the bottom thickness 310 may be in the range of approximately 5 nm. In another exemplary process, for an ion energy of approximately 100 eV, the sidewall thickness 305 may be an oxide in the range of 1 nm and the bottom thickness 310 may be in the range of approximately 2 nm. It will be recognized that such thicknesses are merely exemplary. In relative terms, in one exemplary embodiment, the thickness of the etch stop layer at the bottom of the features may be in a range of two to three times as thick as the thickness of the etch stop layer on the sidewalls of the features. Again, it will be recognized that such examples are merely illustrative and other relative thicknesses may be used. In one exemplary process, the additional over etch step for an oxide etch stop layer may be a fluorine based plasma etch or a chlorine based plasma etch. One exemplary process (for use in the FIG. 1C embodiment) may have an plasma source power at approximately 0-2000 Watts, an RF bias power at 0-200 Watts, pressure 100 mTorr and a gas mixture of 50% chlorine and 50% argon. In another exemplary process (for use in the FIG. 2C embodiment), the process may have similar process conditions as described above except a gas mixture of nitrogen trifluoride/chlorine/argon. It will be recognized that these processes are merely exemplary.

Figure 4:
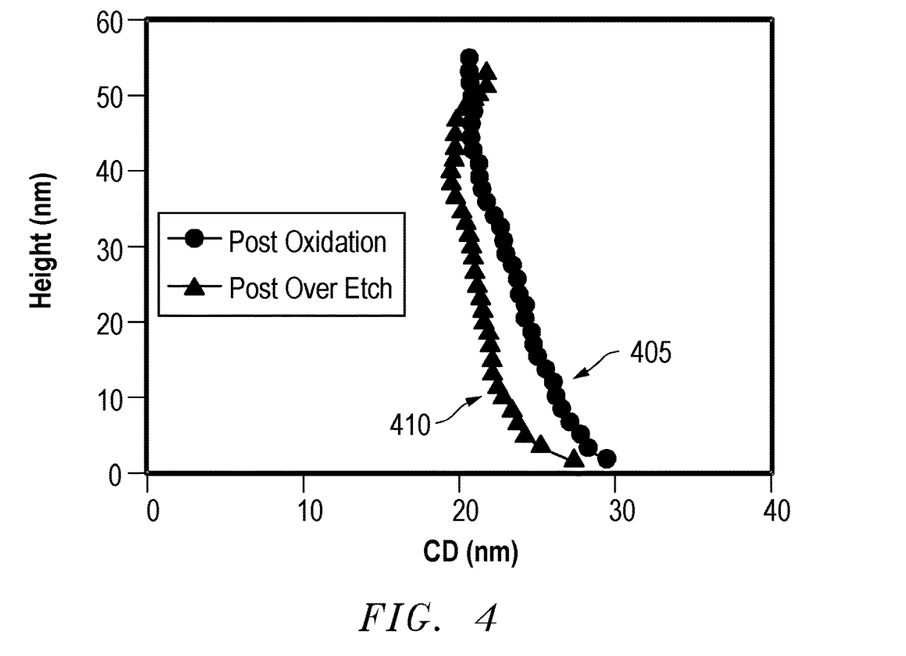
FIG. 4 illustrates exemplary changes in critical dimensions utilizing the techniques disclosed herein.

As described herein, a process to provide lateral etching of sidewalls is provided. It will be recognized that perfectly vertical sidewalls may not be achievable due to normal process fluctuations, tolerances, an inaccuracies. Thus, though perfectly vertical sidewalls may not be achieved, use of the techniques described herein may provide improvements to the slope of the sidewalls as opposed to the sidewalls without the use of the techniques described herein. Shown in FIG. 4 is an exemplary data of the sidewall slope of a structure that is approximately 59 nm tall. As shown in the graph, the height of the structure is compared to the critical dimension (CD) of the structure. Specifically, the graph plots the height of the structure versus the CD of the structure after formation of the etch stop layer (in this case post formation of an oxide layer) in a first plot 405 and the height of the structure versus the CD of the structure post over etch (for example the additional etch of FIG. 1C) as shown in a second plot 410. As can be seen, the CDs indicate less slope in the structure post over etch.

Figure 5:
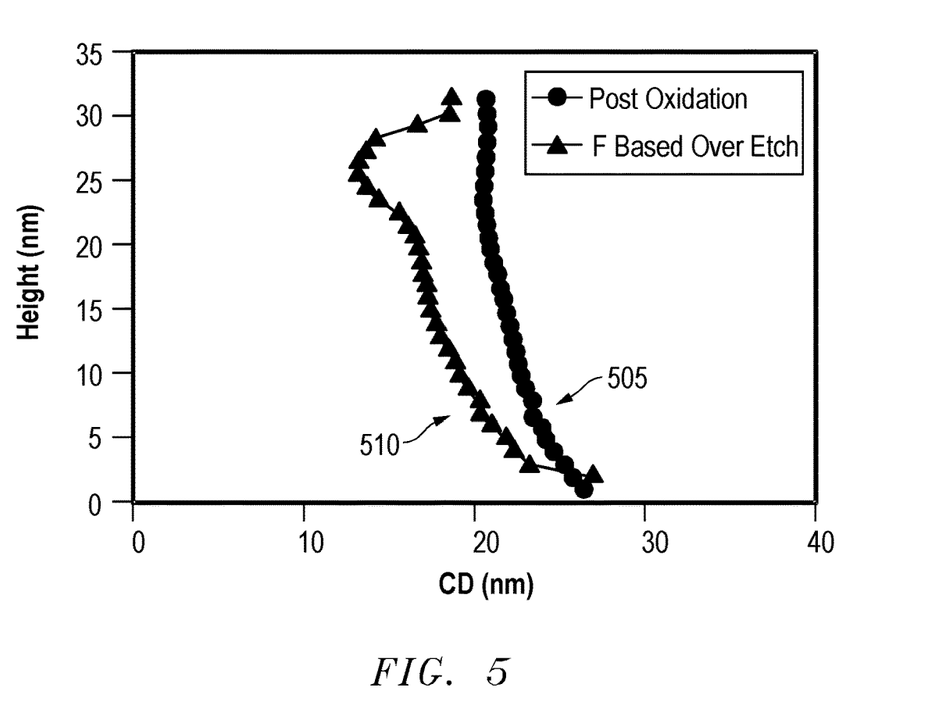
FIG. 5 illustrates exemplary changes in critical dimensions utilizing the techniques disclosed herein.

Similarly, FIG. 5 illustrates exemplary data for use of lateral etching to form a lateral undercut etched structure. In the example of FIG. 5, the mask has an approximate CD of 20 nm and the etched structure has an approximate height of 31 nm. As shown in the graph of FIG. 5, the height of the structure is compared to the critical dimension (CD) of the structure. Specifically, the graph plots the height of the structure versus the CD of the structure after formation of the etch stop layer (in this case post formation of an oxide layer) in a first plot 505 and the height of the structure versus the CD of the structure post over etch (for example the additional etch of FIG. 2C) as plot 510. As can be seen, the CDs indicate lateral etching undercutting the approximate 20 nm mask CD.

Thus, a process has been provided in which an RF plasma may be used to create a controllable thicker etch stop layer over horizontal surfaces compared to sidewall surfaces. The process may be utilized with standard plasma etch processes such that the etch stop layer may be formed in-situ with the etch process. Further, the initial etching of the features 105, the formation of the etch stop layer and the additional etching of the features 105 (after the etch stop layer formation) may all be performed in-situ in one multi-step process in a process tool. The disclosed process may be used to provide lateral etching. The lateral etching may be used to improve the slope characteristics of sidewalls and/or provide etch undercut. The process may be used with a wide variety of etch process tools, may be used with a wide variety of materials that are to be etched and a wide variety of etch stop materials.

Figure 6:
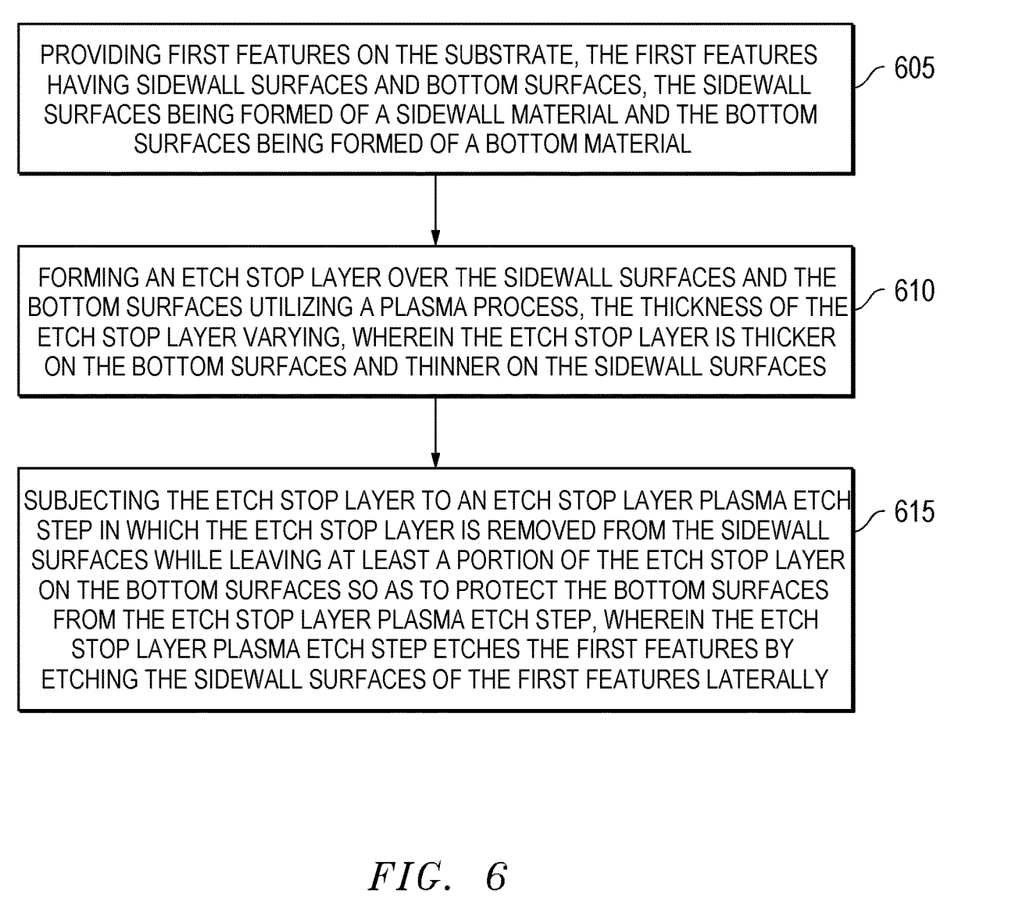
FIGS. 6-8 illustrate exemplary methods for use of an etch stop layer to achieve lateral etching of a substrate feature using the techniques described herein.
Figure 7:
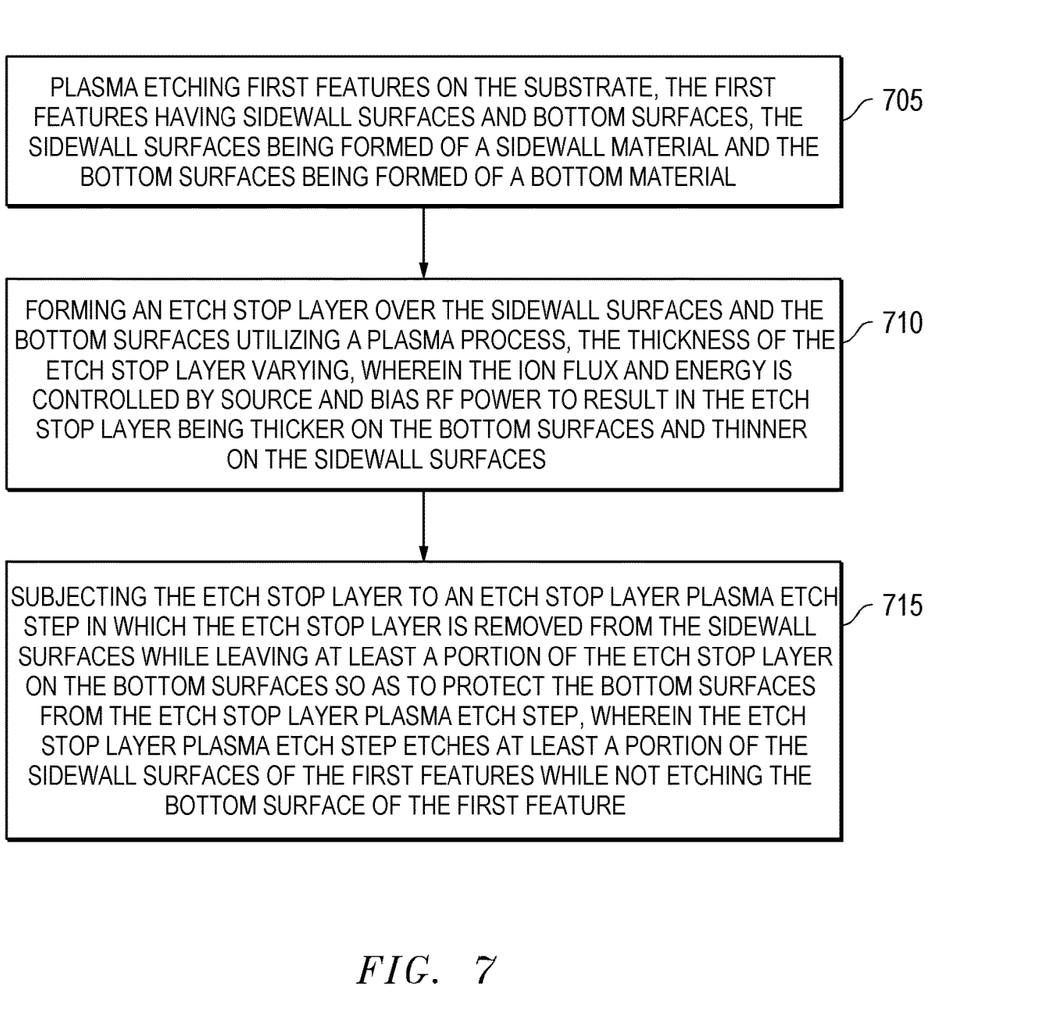
Figure 8:
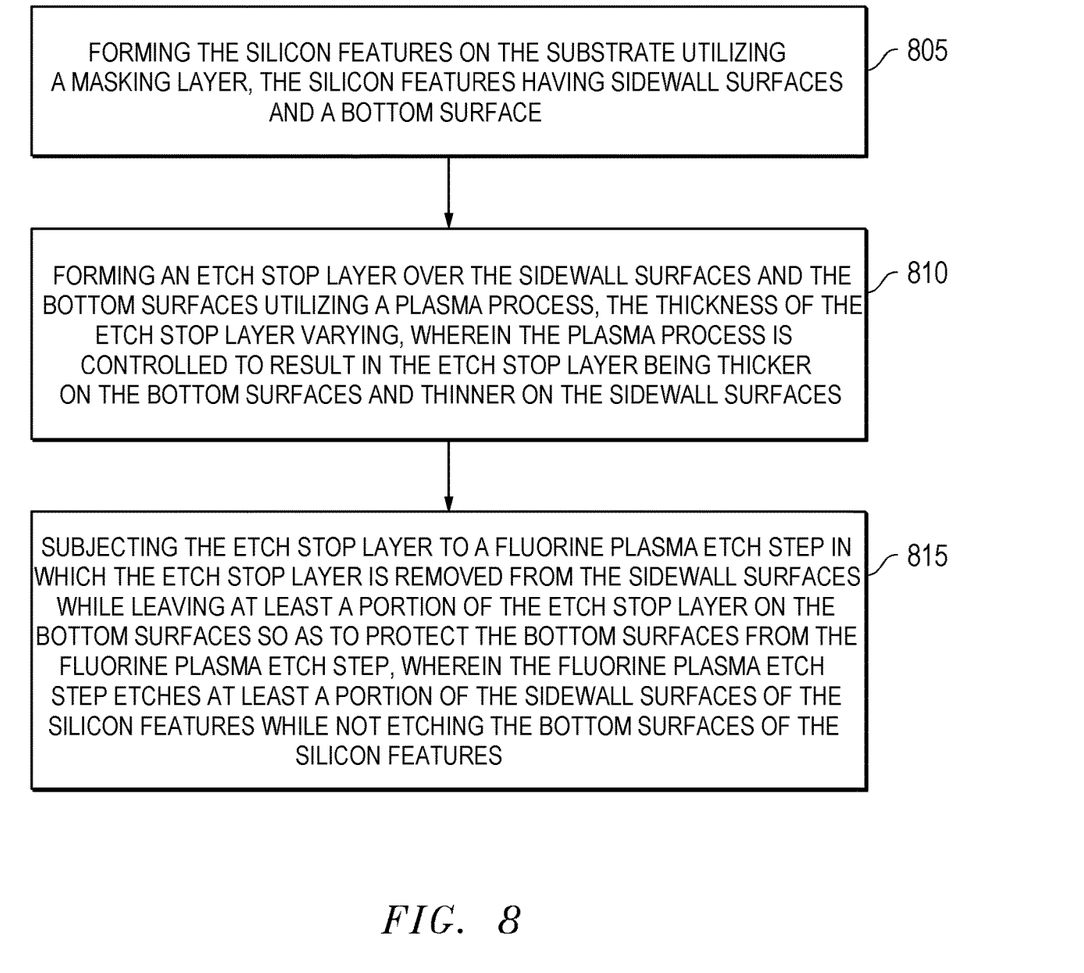

It will be recognized that the applications described above are merely exemplary, and many other processes and applications may advantageously utilize the techniques disclosed herein. FIGS. 6-8 illustrate exemplary methods for use of the processing techniques described herein. It will be recognized that the embodiments of FIGS. 6-8 are merely exemplary and additional methods may utilize the techniques described herein. Further, additional processing steps may be added to the methods shown in the FIGS. 6-8 as the steps described are not intended to be exclusive. Moreover, the order of the steps is not limited to the order shown in the figures as different orders may occur and/or various steps may be performed in combination or at the same time.

In FIG. 6, a method of etching a substrate is shown. The method includes step 605 of providing first features on the substrate, the first features having sidewall surfaces and bottom surfaces, the sidewall surfaces being formed of a sidewall material and the bottom surfaces being formed of a bottom material. The method further includes step 610 for forming an etch stop layer over the sidewall surfaces and the bottom surfaces utilizing a plasma process, the thickness of the etch stop layer varying, wherein the etch stop layer is thicker on the bottom surfaces and thinner on the sidewall surfaces. Finally, the method includes step 615 of subjecting the etch stop layer to an etch stop layer plasma etch step in which the etch stop layer is removed from the sidewall surfaces while leaving at least a portion of the etch stop layer on the bottom surfaces so as to protect the bottom surfaces from the etch stop layer plasma etch step, wherein the etch stop layer plasma etch step etches the first features by etching the sidewall surfaces of the first features laterally.

In FIG. 7, another method of etching a substrate is shown. The method includes step 705 of plasma etching first features on the substrate, the first features having sidewall surfaces and bottom surfaces, the sidewall surfaces being formed of a sidewall material and the bottom surfaces being formed of a bottom material. The method further includes step 710 for forming an etch stop layer over the sidewall surfaces and the bottom surfaces utilizing a plasma process, the thickness of the etch stop layer varying, wherein the ion flux and energy is controlled by source and bias RF power to result in the etch stop layer being thicker on the bottom surfaces and thinner on the sidewall surfaces. The method also includes step 715 for subjecting the etch stop layer to an etch stop layer plasma etch step in which the etch stop layer is removed from the sidewall surfaces while leaving at least a portion of the etch stop layer on the bottom surfaces so as to protect the bottom surfaces from the etch stop layer plasma etch step, wherein the etch stop layer plasma etch step etches at least a portion of the sidewall surfaces of the first features while not etching the bottom surfaces of the first feature.

In FIG. 8, a method of etching silicon features of a substrate is shown. The method comprises step 805 of forming the silicon features on the substrate utilizing a masking layer, the silicon features having sidewall surfaces and a bottom surface. The method also includes step 810 of forming an etch stop layer over the sidewall surfaces and the bottom surfaces utilizing a plasma process, the thickness of the etch stop layer varying, wherein the plasma process is controlled to result in the etch stop layer being thicker on the bottom surfaces and thinner on the sidewall surfaces. The method further includes step 815 of subjecting the etch stop layer to a fluorine plasma etch step in which the etch stop layer is removed from the sidewall surfaces while leaving at least a portion of the etch stop layer on the bottom surfaces so as to protect the bottom surfaces from the fluorine plasma etch step, wherein the fluorine plasma etch step etches at least a portion of the sidewall surfaces of the silicon features while not etching the bottom surfaces of the silicon features.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of etching a substrate, the method comprising:
   providing first features on the substrate, the first features having sidewall surfaces and bottom surfaces, the sidewall surfaces being formed of a sidewall material and the bottom surfaces being formed of a bottom material;
   forming an etch stop layer over the sidewall surfaces and the bottom surfaces utilizing a plasma process, a thickness of the etch stop layer varying, wherein the etch stop layer is thicker on the bottom surfaces and thinner on the sidewall surfaces; and
   subjecting the etch stop layer to an etch stop layer plasma etch step comprising laterally etching the first features until the etch stop layer is removed from the sidewall surfaces and a portion of the sidewall material is removed while leaving at least a portion of the etch stop layer on the bottom surfaces so as to protect the bottom surfaces from the etch stop layer plasma etch step, wherein the etch stop layer plasma etch step laterally etches the first features so as to provide a critical dimension of the first features which is smaller than a critical dimension of a mask overlying the first feature.

2. The method of claim 1, wherein the plasma process is driven by a penetration depth of ions rather than radicals.

3. The method of claim 1, wherein the providing first features on the substrate is accomplished using a first feature plasma etch process.

4. The method of claim 3, herein the first feature plasma etch process, the plasma process and the etch stop layer plasma etch step are performed in-situ in one multi-step process.

5. The method of claim 4, wherein the sidewall material is silicon and the bottom material is silicon.

6. The method of claim 5, wherein the etch stop layer is an oxide layer.

7. The method of claim 5, wherein the etch stop layer is a nitride layer.

8. A method of etching a substrate, the method comprising:
   plasma etching first features on the substrate, the first features having sidewall surfaces and bottom surfaces, the sidewall surfaces being formed of a sidewall material and the bottom surfaces being formed of a bottom material;
   forming an art etch stop layer over the sidewall surfaces and the bottom surfaces utilizing a plasma process, a thickness of the etch stop layer varying, wherein an ion flux and energy is controlled by source and bias RF power to result in the etch stop layer being thicker on the bottom surfaces and thinner on the sidewall surfaces; and
   subjecting the etch stop layer to etch stop layer plasma etch step comprising laterally etching the first features until the etch stop layer is removed from the sidewall surfaces and a portion of the sidewall material is removed while leaving at least a portion of the etch stop layer on the bottom surfaces so as to protect the bottom surfaces from the etch stop layer plasma etch step, wherein the etch stop layer plasma etch step laterally etches the first features so as to provide a critical dimension of the first features which is smaller than a critical dimension of a mask overlying the first feature.

9. The method of claim 8, wherein the etch stop layer plasma etch step results in the sidewall surfaces of the first features being more vertical as compared to before the etch stop layer plasma etch step.

10. The method of claim 9, wherein the sidewall material is silicon and the bottom material is silicon.

11. The method of claim 10, wherein the etch stop layer is an oxide layer.

12. The method of claim 10, wherein the etch stop layer is a nitride layer.

13. The method of claim 8, wherein the sidewall material is silicon and the bottom material is silicon.

14. The method of claim 13, wherein the etch stop layer is an oxide layer.

15. The method of claim 13, wherein the etch stop layer is a nitride layer.

16. A method of etching silicon features of a substrate, the method comprising:
  forming the silicon features on the substrate utilizing a masking layer, the silicon features having sidewall surfaces and bottom surfaces;
  forming an etch stop layer over the sidewall surfaces and the bottom surfaces utilizing a plasma process, a thickness of the etch stop layer varying, wherein the plasma process is controlled to result in the etch stop layer being thicker on the bottom surfaces and thinner on the sidewall surfaces; and
  subjecting the etch stop layer to a fluorine plasma etch step comprising laterally etching the first features until the etch stop layer is removed from the sidewall surfaces and a portion of the sidewall material is removed while leaving at least a portion of the etch stop layer on the bottom surfaces so as to protect the bottom surfaces from the fluorine plasma etch step, wherein the fluorine plasma etch step laterally etches the silicon features so as to provide a critical dimension of the silicon features which is smaller than a critical dimension of the masking layer overlying the silicon features.

17. The method of claim 16, wherein the plasma process and fluorine plasma etch step are performed in-situ in a process tool by utilizing one multi step process.

18. The method of claim 17, wherein the etch stop layer is a silicon oxide or silicon nitride layer.

19. A method of etching a substrate, the method comprising:
  plasma etching first features on the substrate, the first features having sidewall surfaces and bottom surfaces, the sidewall surfaces being formed of a sidewall material and the bottom surfaces being formed of a bottom material;
  forming an etch stop layer over the sidewall surfaces and the bottom surfaces utilizing a plasma process, a thickness of the etch stop layer varying, wherein an ion flux and energy is controlled by source and bias RF power to result in the etch stop layer being thicker on the bottom surfaces and thinner on the sidewall surfaces; and
  subjecting the etch stop layer to an etch stop layer plasma etch step in which the etch stop layer is removed from the sidewall surfaces while leaving at least a portion of the etch stop layer on the bottom surfaces so as to protect the bottom surfaces from the etch stop layer plasma etch step, wherein the etch stop layer plasma etch step laterally etches the first features so as to provide a critical dimension of the first features which is smaller than a critical dimension of a mask overlying the first feature;
  wherein the etch stop layer plasma etch step etches at least a portion of the sidewall surfaces of the first features while not etching the bottom surfaces of the first features.

* * * * *